(12) United States Patent
Dsaak et al.

(10) Patent No.: US 9,108,798 B2
(45) Date of Patent: Aug. 18, 2015

(54) TRANSPORT ROLLER AND TRANSPORT DEVICE FOR A HORIZONTAL CONTINUOUS SUBSTRATE TREATMENT APPARATUS

(71) Applicant: VON ARDENNE GMBH, Dresden (DE)

(72) Inventors: Torsten Dsaak, Dresden (DE); Steffen Mosshammer, Rabenau (DE); Thomas Meyer, Dresden (DE); Jan Kircheis, Bannewitz (DE); Michael Hofmann, Dresden (DE)

(73) Assignee: VON ARDENNE GmbH, Dresden (DE)

( * ) Notice: Subject to any disclaimer, the term of this patent is extended or adjusted under 35 U.S.C. 154(b) by 0 days.

(21) Appl. No.: 14/315,795

(22) Filed: Jun. 26, 2014

(65) Prior Publication Data
US 2015/0001037 A1    Jan. 1, 2015

(30) Foreign Application Priority Data
Jun. 27, 2013 (DE) .................. 10 2013 106 736

(51) Int. Cl.
*B65G 13/00*    (2006.01)
*F27B 5/12*    (2006.01)

(52) U.S. Cl.
CPC .. *B65G 13/00* (2013.01); *F27B 5/12* (2013.01)

(58) Field of Classification Search
USPC ........................................ 492/42, 43; 193/37
See application file for complete search history.

(56) References Cited

U.S. PATENT DOCUMENTS

| 4,242,782 | A | | 1/1981 | Hanneken et al. |
| 4,751,776 | A | | 6/1988 | Reunamaki |
| 4,975,347 | A | * | 12/1990 | Ahne et al. ...................... 430/18 |
| 5,906,567 | A | | 5/1999 | Gautier |
| 2004/0178043 | A1 | * | 9/2004 | Brinkmeier et al. ............ 193/37 |
| 2007/0181400 | A1 | * | 8/2007 | Evans .............................. 193/37 |
| 2008/0010831 | A1 | * | 1/2008 | Gamberini ................. 29/895.21 |

FOREIGN PATENT DOCUMENTS

| DE | 3006114 C3 | 9/1981 |
| EP | 0388206 A1 | 9/1990 |
| EP | 0393292 A1 | 10/1990 |
| EP | 0789829 A1 | 8/1997 |
| WO | 2010094716 A1 | 8/2010 |

OTHER PUBLICATIONS

Japan Patent Laying-Open Gazette No. 6-171730, see claim 1.*

* cited by examiner

*Primary Examiner* — Gene Crawford
*Assistant Examiner* — Lester Rushin
(74) *Attorney, Agent, or Firm* — Heslin Rothenberg Farley & Mesiti P.C.

(57) ABSTRACT

A conveying roller for a horizontal continuous substrate treatment plant, has a roller body with two ends and two end caps having a receiving opening. Each end of the roller body is arranged in a receiving opening of an end cap. The end cap has two end cap parts which can be releasably connected to one another and which jointly form the receiving opening. The receiving opening is larger than the outside diameter of the end of the roller body. At least two elastic rings which center the roller body in the receiving opening are arranged on the end of the roller body.

15 Claims, 3 Drawing Sheets

TRANSPORT ROLLER AND TRANSPORT DEVICE FOR A HORIZONTAL CONTINUOUS SUBSTRATE TREATMENT APPARATUS

CROSS REFERENCE TO RELATED APPLICATIONS

This application claims priority of German application No. 10 2013 106 736.0 filed on Jun. 27, 2013, the entire contents of which is hereby incorporated by reference herein.

BACKGROUND ART

The invention relates to improvements to a horizontal continuous substrate treatment plant for the treatment, for example coating, of slab-shaped substrates, for example glass panels, wherein the substrates, with or without substrate mounts, lying on a conveying device, i.e. in a horizontal orientation, are conveyed through a plant chamber delimited by chamber walls or an arrangement of a plurality of plant chambers arranged behind one another of a substrate treatment plant, wherein the substrates are subjected to the effect of at least one substrate treatment device, such as, for example, coating devices, etching devices, etc. The substrate treatment, on the one hand, often takes place under a pressure which is lower than the atmospheric pressure (process vacuum), and, on the other hand, also often in a selected gas or gas mixture which is often introduced in a controlled manner (process atmosphere).

In contrast to what are referred to as batch substrate treatment plants, in continuous substrate treatment plants generally at least in each case a plant chamber, which is configured as a lock chamber, is located upstream and downstream of the plant chamber or an arrangement of a plurality of plant chambers arranged behind one another, which may be configured, for example, as process chambers, pump chambers, transfer chambers, etc., and a conveying device is arranged inside the substrate treatment plant such that said conveying device extends through the two lock chambers and through all other plant chambers arranged in between.

As a result, substrates can be moved in a conveying direction through the substrate treatment plant in that they are introduced into the substrate treatment plant by means of a first lock chamber, conveyed through the entire arrangement of plant chambers arranged behind one another by means of the conveying device, and are evacuated from the substrate treatment plant by means of a second lock chamber. Here, the substrates in at least one process chamber are also moved past a substrate treatment device arranged in said process chamber and thereby subjected to the desired substrate treatment For the treatment of slab-shaped substrates, conveying devices have proven successful which comprise a plurality of rotatably mounted, cylindrical conveying rollers which are arranged transversely to the conveying direction of the substrates, the uppermost generatrices of said conveying rollers defining a horizontal conveying plane for the substrates, and at least some of said conveying rollers being drivable. In the event that the desired substrate treatment takes place under elevated process temperatures, for example 400, 600 or 800° C., it has proven successful to produce the conveying rollers from heat-resistant materials, for example ceramics, or to coat them with a heat-resistant material.

The invention relates to a conveying roller for a conveying device of a horizontal continuous substrate treatment plant, in particular for carrying out coating and/or etching processes on flat (slab-shaped) substrates such as architectural glass, solar cells and so on, and to a conveying device having such conveying rollers. Such processes generally take place at subatmospheric pressure, where appropriate in the presence of a process gas, for example an inert gas or a reactive gas, and in some cases under high temperatures, for example 600 or 800° C.

Depending on the particular application, the conveying rollers can be manufactured from metallic materials, for example stainless steel or aluminum, or from nonmetallic materials, for example industrial ceramic such as aluminum oxide, silicon dioxide and so on. In the case of conveying rollers made of ceramic materials, it is further known to provide the ends, on which the conveying rollers are rotatably mounted, with end caps made of metallic materials which serve to mount, center and transmit the force of the conveying rollers. Here, the connection between the roller body and the end cap must satisfy two conditions; firstly, the end cap must be seated concentrically on the end of the roller body in order to ensure the concentric running of the conveying roller, and, secondly, the connection between the two must be such that the torque required to drive the conveying roller can be transmitted.

It is known to produce the connection between the end cap and the roller body by means of adhesive bonding; however, this solution has obvious disadvantages with regard to the temperature resistance of the connecting point between ceramic and metal and by virtue of the fact that an adhesive connection is nonreleasable. Particularly in coating plants in which the conveying rollers are exposed to contamination during the operation, there is moreover the risk that chemical cleaning processes adversely affect the adhesives such that the end caps can become released from the roller body.

In EP 0 393 292 A1 and EP 0 388 206 B1, slotted sleeves have been proposed for mounting ceramic roller bodies, which sleeves are braced from outside against the roller body by means of clamping screws. However, highly accurate centering is not possible therewith.

In U.S. Pat. No. 5,906,567 it is, by contrast, proposed to connect the end caps to the roller body by means for producing a rotationally fixed connection and additionally by means for centering. This solution is very complicated and therefore involves high costs.

DE 30 06 114 C3 discloses a solution in which a radial clamping ring which is intended to effect the transmission of torque is arranged between the roller body and the end cap. However, this approach is problematic because the radial clamping ring can naturally exert a force only on one of the two components to be connected and thus now tight limits are set for the size of the torque which can be transmitted.

Various further approaches are known from EP 0 789 829 B1, for example using bimetallic lamellae or wedges and elastic means interacting therewith or pins arranged transversely to the longitudinal axis of the roller.

WO 2010/094716 A1 has proposed a conveying roller for the vacuum treatment of substrates, which comprises a ceramic roller body with two ends and two metallic end caps with in each case a receiving opening, wherein each end of the roller body is arranged in a receiving opening of an end cap and is connected in a rotationally fixed manner to the end cap, and at least one helical spring or a clamping pin parallel to the axis of symmetry (longitudinal axis) of the roller body is arranged between the end of the roller body and the receiving opening of the end cap.

BRIEF SUMMARY OF THE INVENTION

What is proposed is a conveying roller for a horizontal continuous substrate treatment plant, comprising a roller body with two ends and two end caps with in each case a receiving opening, wherein each end of the roller body is arranged in a receiving opening of an end cap, the end cap has two end cap parts which can be connected releasably to one another and which together form the receiving opening, the receiving opening is larger than the outside diameter of the end of the roller body, and at least two elastic rings which center the roller body in the receiving opening are arranged on the end of the roller body.

The two end cap parts are connected to one another in a parting plane which runs parallel to the axis of symmetry of the roller body. Each end cap part forms a half of the receiving opening which is required to receive an end region of the roller body. In this way, the two end cap parts jointly form the receiving opening when they are connected to one another, wherein each end cap part encloses half of the circumference of the end of the roller body. If one end cap part is removed, it is thereby possible for the roller body to be removed in a simple manner transversely to its axis of symmetry from the other end cap part. As a result, it is possible that the other end cap part remains in its rotary bearing when the roller body has to be removed from the substrate treatment plant for cleaning.

The elastic rings can be produced for example from Viton. This material is permanently elastic and heat-resistant.

By virtue of the elastic rings, the exact centering of the roller body in the receiving opening of the end cap is extremely simple. In addition, the elastic rings can excellently compensate for different thermal expansions of the roller body and end cap, with the result that breakages of the roller body can be avoided, in particular if brittle material such as glass or the like is used for the roller body. As a result of the proposed solution, an axial displacement between the roller body and end cap owing to thermal expansions is possible. At the same time, the bracing of the roller body and end cap by the elastic rings ensures reliable transmission of the torque for driving the conveying roller.

In one embodiment, the position of the at least two elastic rings is defined by at least one sleeve arranged on the end of the roller body. Such a sleeve can be manufactured for example from Teflon. This material is heat-resistant and can be easily cleaned if undesired layers are deposited thereon.

It can be provided here that, in order to protect the edge of the roller body, at least one sleeve has an inwardly projecting collar. As a result, in particular if brittle material such as glass or the like is used for the roller body, the peripheral edge at the end of the roller body is protected from damage.

In one embodiment, it is provided that a first end cap part, which has a first portion of the receiving opening, for example a half of the receiving opening, for the roller body, has at its end opposite the receiving opening an extension which is designed as a shaft stub for direct mounting or for connection to a rotatably mounted hub. In another embodiment, it is provided that the first end cap part has an extension which is designed as a hub for connection to a rotatably mounted shaft. The second end cap part has a first portion for the receiving opening for the roller body, for example the other half of the receiving opening, and can be connected releasably to the first end cap part, for example by means of screws arranged perpendicularly to the axis of rotation of the conveying roller.

In a particularly advantageous manner, it can be further provided that the hub is axially displaceable on the shaft. This additionally facilitates the fitting and removal of the roller body. For example, a shaft, to which the respective end cap is fastened, can be rotatably mounted for each end of each conveying roller in the continuous substrate treatment plant. In the case described in which the end cap has an axially displaceable hub, said hub can be displaced on the shaft after the second end cap part has been removed, with the result that the end of the conveying roller is free and the conveying roller can thereby be simply removed, for example for cleaning purposes.

In this case, it is provided according to another development that the hub is displaceable against the force of a spring. This embodiment further has the advantage that the roller body is centered between the two end caps, but also that the end cap follows any change in length of the roller body owing to thermal expansions.

According to another embodiment, it is provided that the roller body is hollow cylindrical and a radiation protector is arranged in its interior. Consequently, there can be a material and weight saving for the conveying roller, and at the same time the end cap and in particular the adjoining bearing arrangement are protected from thermal radiation from the interior of the roller body. This is of importance in particular for conveying rollers whose roller body is manufactured from glass or the like.

In a development, the radiation protector comprises at least two metal sheets which are arranged perpendicular to the center axis of the conveying roller and at a distance from one another.

In this case, it can be further provided that each metal sheet has at least one opening and the metal sheets are arranged such that the openings of in each case two adjacent metal sheets do not overlap. The openings serve the purpose of also being able to evacuate the interior of the roller body in order to avoid a negative influencing of the process atmosphere by air exiting from the interior of the conveying roller during the operation of the continuous substrate treatment plant. However, the bores of the individual metal sheets are arranged in an offset manner with respect to one another because otherwise they would offer only a greatly limited protection of the rotary bearing from radiant heat.

In a particularly advantageous manner, it can be further provided that the radiation protector is produced in one piece from a folded metal sheet which has at least two circular portions and, between in each case two circular portions, a web connecting them. Here, one circular portion can have a larger diameter such that this portion cannot slide into the interior of the roller body and thus holds the entire assembly of metal shielding sheets exactly in position. All the other circular portions have a diameter which corresponds to the inside diameter of the roller body such that they cover as completely as possible its inner cross section.

The conveying rollers described can be used in a particularly advantageous manner in a conveying device for a horizontal continuous substrate treatment plant, which comprises a plurality of rotatably mounted, cylindrical conveying rollers which are arranged transversely to the conveying direction of the substrates, the uppermost generatrices of said conveying rollers defining a horizontal conveying plane for the substrates, and at least some of said conveying rollers being drivable.

In this case, for example, of at least one of the end caps of the conveying rollers, a first end cap part can have an extension which is designed as a hub and is connected to a rotatably mounted shaft. In order to be able to remove the roller bodies quickly and simply, the hub is advantageously axially displaceable on the shaft, to be precise preferably against the force of a spring.

BRIEF DESCRIPTION OF THE DRAWINGS

The invention will be explained in more detail below with reference to an exemplary embodiment and associated drawings, in which.

DETAILED DESCRIPTION

Figure 1:
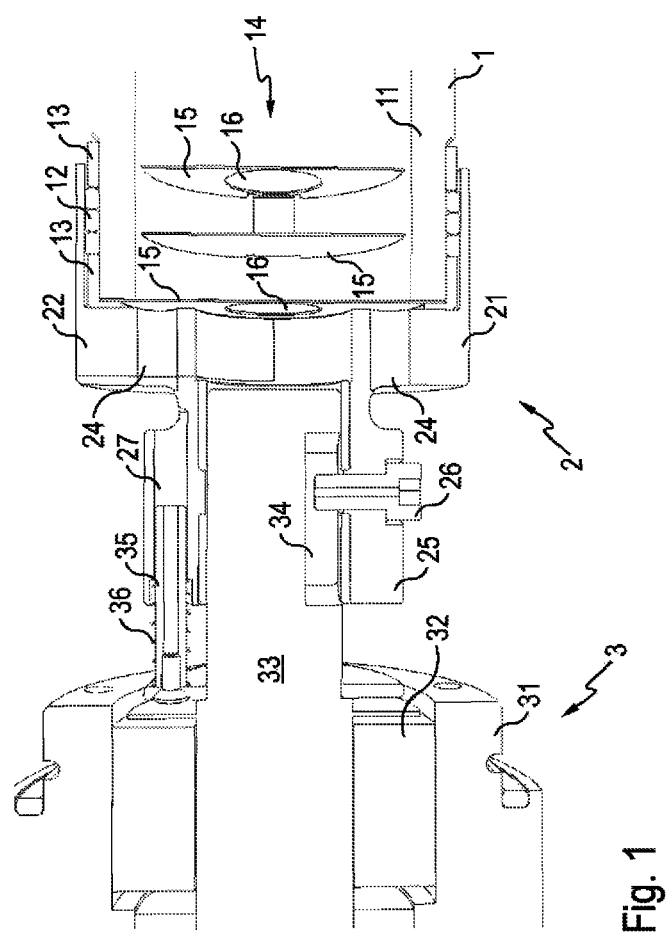
FIG. 1 shows a first end of a conveying roller.
Figure 2:
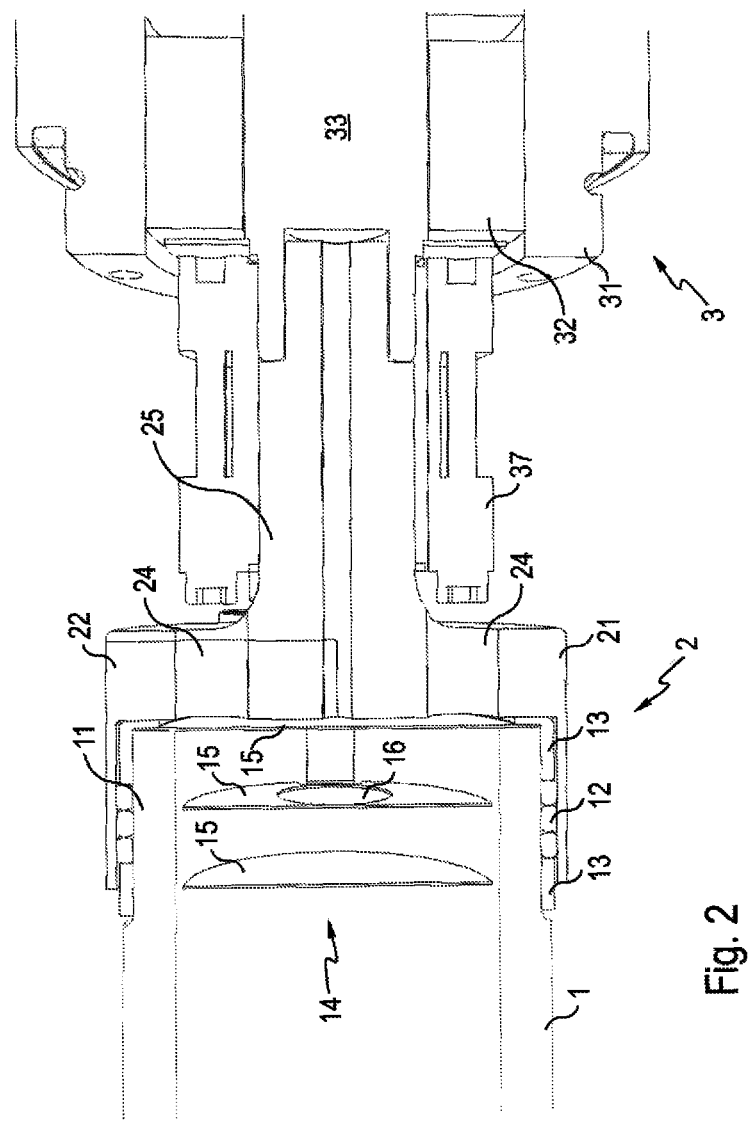
FIG. 2 shows a second end of the conveying roller.

FIGS. 1 and 2 each show an end of a conveying roller which has a roller body 1 with two ends 11 and, at each end 11, a respective end cap 2. The end caps 2 each have a receiving opening in which the respective end 11 of the roller body is received. The roller body 1 is hollow cylindrical and is made of glass. The two ends 11 have a smaller diameter than the remainder of the outer surface of the roller body 1. On this end 11 are seated in each case three elastic rings 12 which enclose the end 11. The position of the three elastic rings 12 is defined by two sleeves 13. One of the two sleeves 13 has a peripheral, inwardly projecting collar which extends over the peripheral edge and the end side of the roller body 1 and thereby protects the roller body 1 from damage.

Each of the two end caps 2 comprises two end cap parts 21 and 22. The first end cap part 21 has a half of the receiving opening and an extension 25. The second end cap part 22 has the second half of the receiving opening and is releasably connected to the first end cap part 21 by means of two screws 23.

The extension 25 is connected at the two end caps to a respective shaft 33 which is rotatably mounted in a rotary bearing 3. In addition to the shaft 33, the rotary bearing 3 comprises a housing 31 and a rolling bearing 32.

A radiation protector 14 is arranged in each case in the interior of the roller body 1. This protector is produced in one piece from a folded sheet metal blank which has three circular portions which are connected to one another by means of webs. Consequently, the radiation protector comprises in total three metal sheets 15 which are arranged parallel to one another and which are arranged perpendicular to the axis of rotation of the roller body. The respective outermost metal sheet 15 has a diameter which is larger than the inside diameter of the roller body 1 such that this metal sheet 15 bears on the end side of the roller body 1 and cannot slide into the roller body 1.

Each of the three metal sheets 15 has a respective opening 16 for evacuating the interior of the roller body 1. For this purpose, the end cap 2 additionally has venting bores 24. The openings 16 of the radiation protector 14 are arranged relative to one another in such a way that they do not intersect with one another in an axial projection, i.e. the openings 16 do not overlap, with the result that thermal radiation passing through an opening 16 always initially encounters a further metal sheet 15.

In the embodiment according to FIG. 1, the extension 25 of the end cap 2 is designed as a hub which is seated on the shaft 33 of the rotary bearing 3. In order to transmit torque, the end cap 2 has a driver in the form of a screw which projects into a groove 34 of the shaft 33.

Furthermore, a disk is arranged on the shaft 33, to which disk is fastened an axial guide pin 35 by means of a screw. This axial guide pin 35 projects into an axial guide bore 27 which is in the extension 25. Consequently, the end cap can be displaced relative to the rotary bearing in order to be able to remove the roller body 1 more easily. On the axial guide pin 35 is seated a spring 36 which provides a return force which always moves the end cap 2 back toward the roller body 1.

Figure 3:
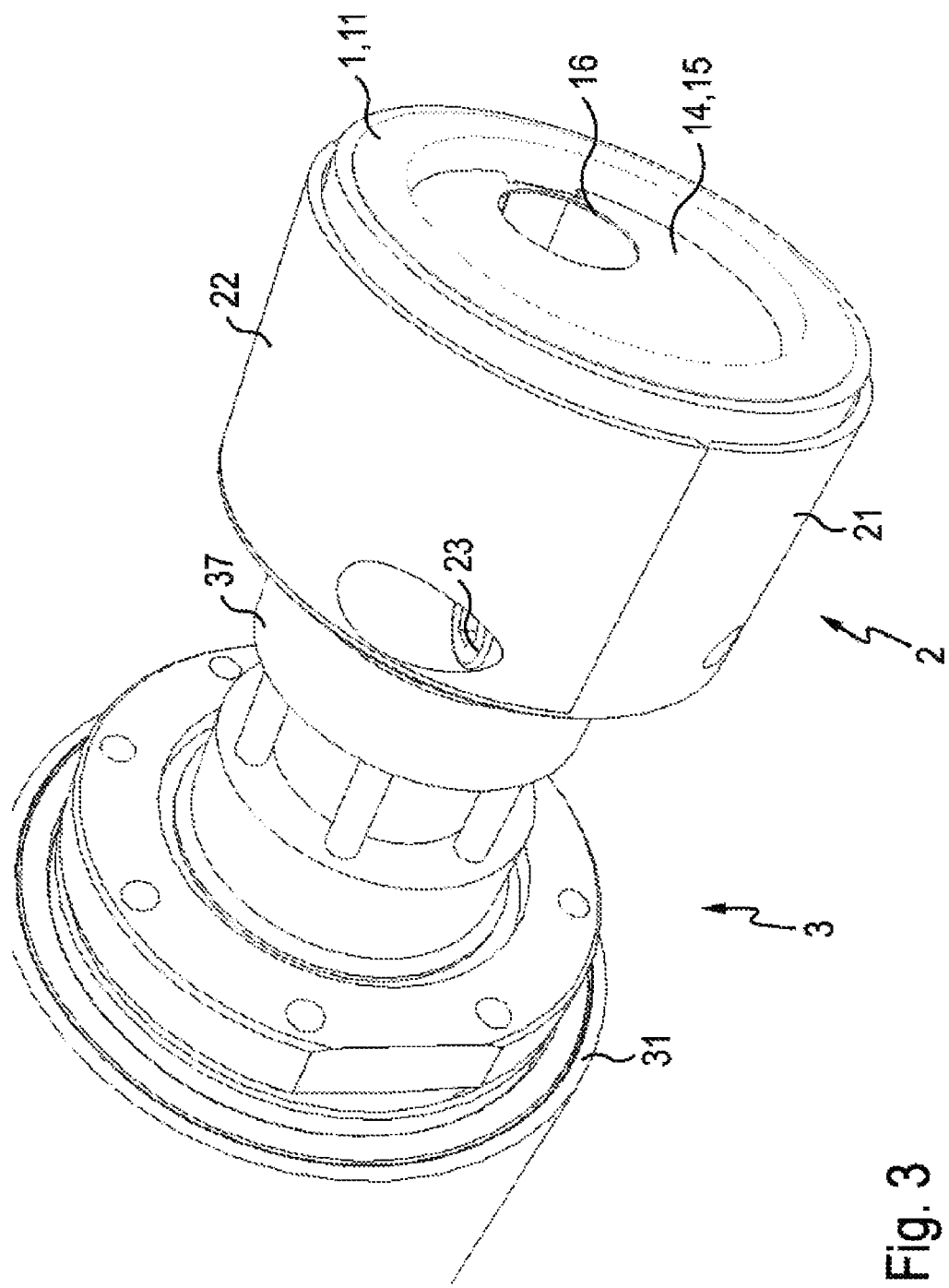
FIG. 3 shows the second end according to FIG. 2 in a perspective view.

In the embodiment according to FIGS. 2 and 3, the extension 25 of the end cap 2 is designed as a shaft which is connected to the shaft 33 of the rotary bearing 3. In order to transmit torque, the extension 25 of the end cap 2 and the shaft 33 of the rotary bearing 3 are connected to one another by means of a connecting element 37. In this embodiment, the end cap 2 is not axially displaceable. However, this is also unnecessary because the axial displacability of the end cap 2 according to FIGS. 2 and 3 is sufficient for easy mounting and demounting of the roller body 1.

The invention claimed is:

1. A conveying roller for a horizontal continuous substrate treatment plant, having a roller body with two ends and two rotatably supported end caps for transmitting torque to the roller body, with each end cap having a receiving opening, wherein each end of the roller body is arranged in a receiving opening of an end cap, wherein at least one end cap of the two end caps has a parting plane which is situated parallel to an axis of symmetry of the roller body and in which there are releasably connected to one another two end cap parts which together form the receiving opening when they are connected to one another and which allow removal of the roller body transversely to the axis of symmetry when an end cap part is removed, wherein the receiving opening is larger than an outside diameter of the end of the roller body, at least one end cap of the two end caps includes, at a side opposite the receiving opening, an extension engagable with a rotatably mounted shaft of a rotary bearing for transmitting torque via the at least one end cap to the roller body, and at least two elastic rings which center the roller body in the receiving opening and brace the roller body and the end cap to rotate together are arranged on the end of the roller body within the receiving opening.

2. The conveying roller as claimed in claim 1, wherein position of the at least two elastic rings is defined by at least one sleeve arranged on the end of the roller body.

3. The conveying roller as claimed in claim 2, wherein, in order to protect the roller body, the at least one sleeve has an inwardly projecting collar extending over a peripheral edge and an end side of the roller body.

4. The conveying roller as claimed in claim 3, wherein the extension extends from a first end cap part and serves either as a hub for connecting to the rotatably mounted shaft of the rotary bearing, or as a shaft stub for direct mounting to the rotatably mounted shaft or for connection to a rotatably mounted hub associated with the rotatably mounted shaft.

5. The conveying roller as claimed in claim 4, wherein the hub is axially displaceable on the shaft.

6. The conveying roller as claimed in claim 5, wherein the hub is displaceable against the force of a spring.

7. The conveying roller as claimed in claim 1, wherein the roller body is hollow cylindrical and a radiation protector is arranged in an interior of the roller body.

8. The conveying roller as claimed in claim 7, wherein the radiation protector comprises at least two metal sheets arranged perpendicular to a center axis of the conveying roller and at a distance from one another.

9. The conveying roller as claimed in claim 8, wherein each metal sheet has at least one opening and the at least two metal sheets are arranged such that the at least one opening of, in each case, two adjacent metal sheets do not overlap.

10. The conveying roller as claimed in claim 7, wherein the radiation protector is produced in one piece from a folded metal sheet which has at least two circular portions connected by a web.

11. A conveying device for a horizontal continuous substrate treatment plant, comprising a plurality of rotatably mounted, cylindrical conveying rollers arranged transversely to a conveying direction of substrates, uppermost generatrices of said conveying rollers defining a horizontal conveying plane for the substrates, and at least some of said conveying rollers being drivable, wherein the conveying rollers include the conveying roller of claim 1.

12. The conveying device as claimed in claim 11, wherein, of at least one of the end caps of the conveying roller, a first end cap part has the extension serving as a hub and connected to the rotatably mounted shaft.

13. The conveying device as claimed in claim 12, wherein the hub is axially displaceable on the shaft.

14. The conveying device as claimed in claim 13, wherein the hub is displaceable against the force of a spring.

15. The conveying roller as claimed in claim 1, wherein each end cap extends at least partially along a cylindrical surface and along an end side of an end of the roller body, and the extension extends parallel to the axis of symmetry of the roller body.

\* \* \* \* \*